United States Patent [19]
Suzuki et al.

[11] Patent Number: 5,329,494
[45] Date of Patent: Jul. 12, 1994

[54] MEMORY CELL ARRAY DIVIDED TYPE SEMICONDUCTOR MEMORY DEVICE

[75] Inventors: Youichi Suzuki; Takenori Nakamura, both of Yokohama, Japan

[73] Assignee: Kabushiki Kaisha Toshiba, Kawasaki, Japan

[21] Appl. No.: 848,152

[22] Filed: Mar. 9, 1992

[30] Foreign Application Priority Data

Mar. 7, 1991 [JP] Japan .................... 3-41902

[51] Int. Cl.$^5$ .................... G11C 8/00; G11C 7/00
[52] U.S. Cl. .................... 365/230.03; 365/189.01; 365/207
[58] Field of Search .................... 365/230.03, 189.01, 365/227, 205, 207, 220

[56] References Cited

U.S. PATENT DOCUMENTS

| | | | |
|---|---|---|---|
| 4,796,234 | 1/1989 | Itoh et al. | 365/230.03 |
| 4,879,692 | 11/1989 | Tokushige | 365/230.03 |
| 4,931,994 | 1/1990 | Matsui et al. | 365/189.01 |

FOREIGN PATENT DOCUMENTS

| | | | |
|---|---|---|---|
| 0117784 | 6/1986 | Japan | 365/205 |
| 0240898 | 9/1990 | Japan | 365/189.01 |

Primary Examiner—Eugene R. LaRoche
Assistant Examiner—Son Dinh
Attorney, Agent, or Firm—Foley & Lardner

[57] ABSTRACT

The memory device of this invention includes a plurality of memory cell blocks each having a plurality of memory cells disposed in a matrix form. A memory cell selector selects a predetermined number of the memory cells in each memory cell block in accordance with external address signals. A sense amplifier unit amplifies data read from the selected memory cells for data read. A data output unit outputs the data amplified by the sense amplifier unit. A block selector selects a desired one or more of the memory cell blocks as data write blocks for data write. A data write unit writes data in the selected memory cells in the selected blocks. A sense amplifier controller supplies, during the data write, a signal to the sense amplifier unit to make the sense amplifier unit inactive, and during the data read supplies a signal to the sense amplifier unit to make the sense amplifier unit active.

16 Claims, 4 Drawing Sheets

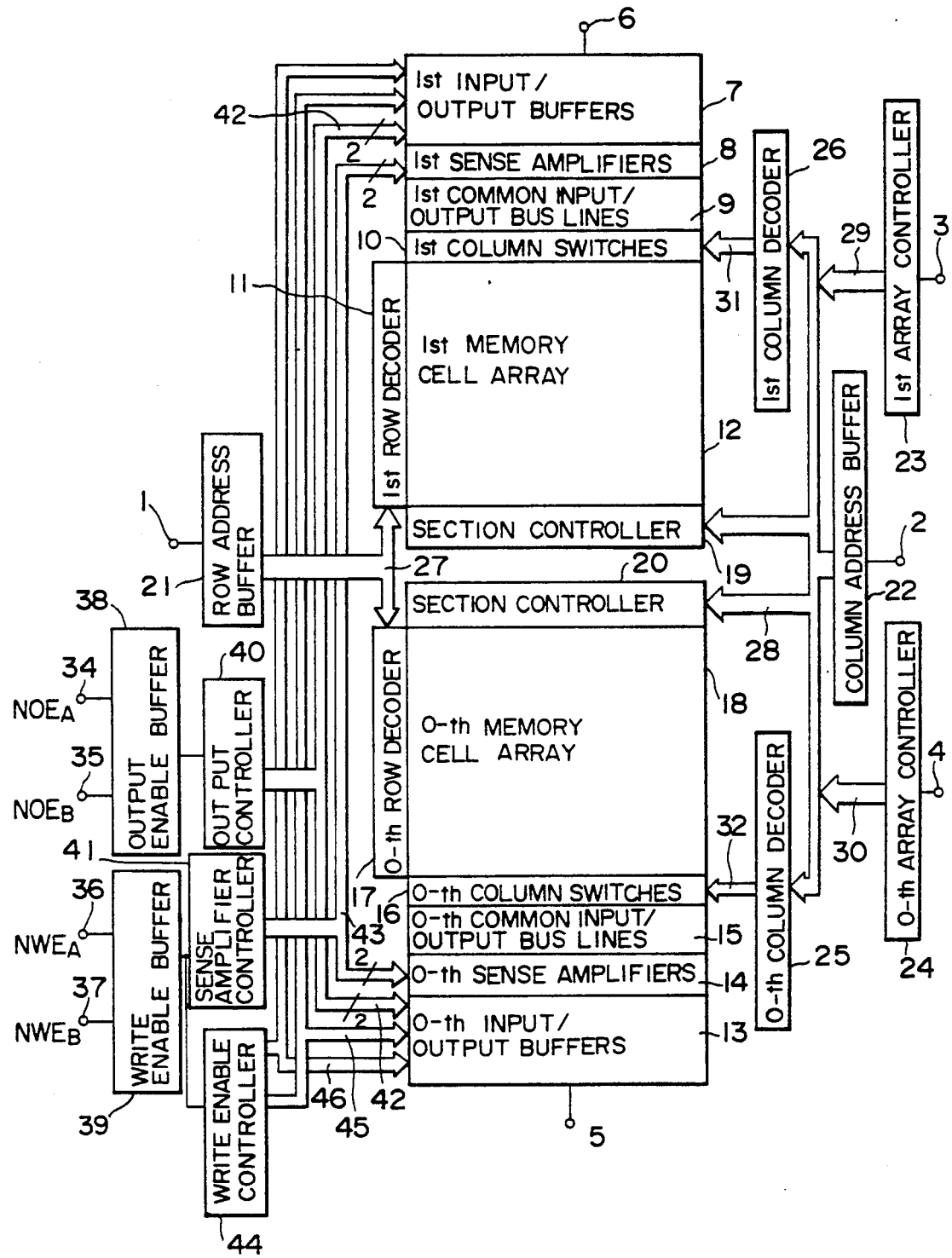
F I G. 1

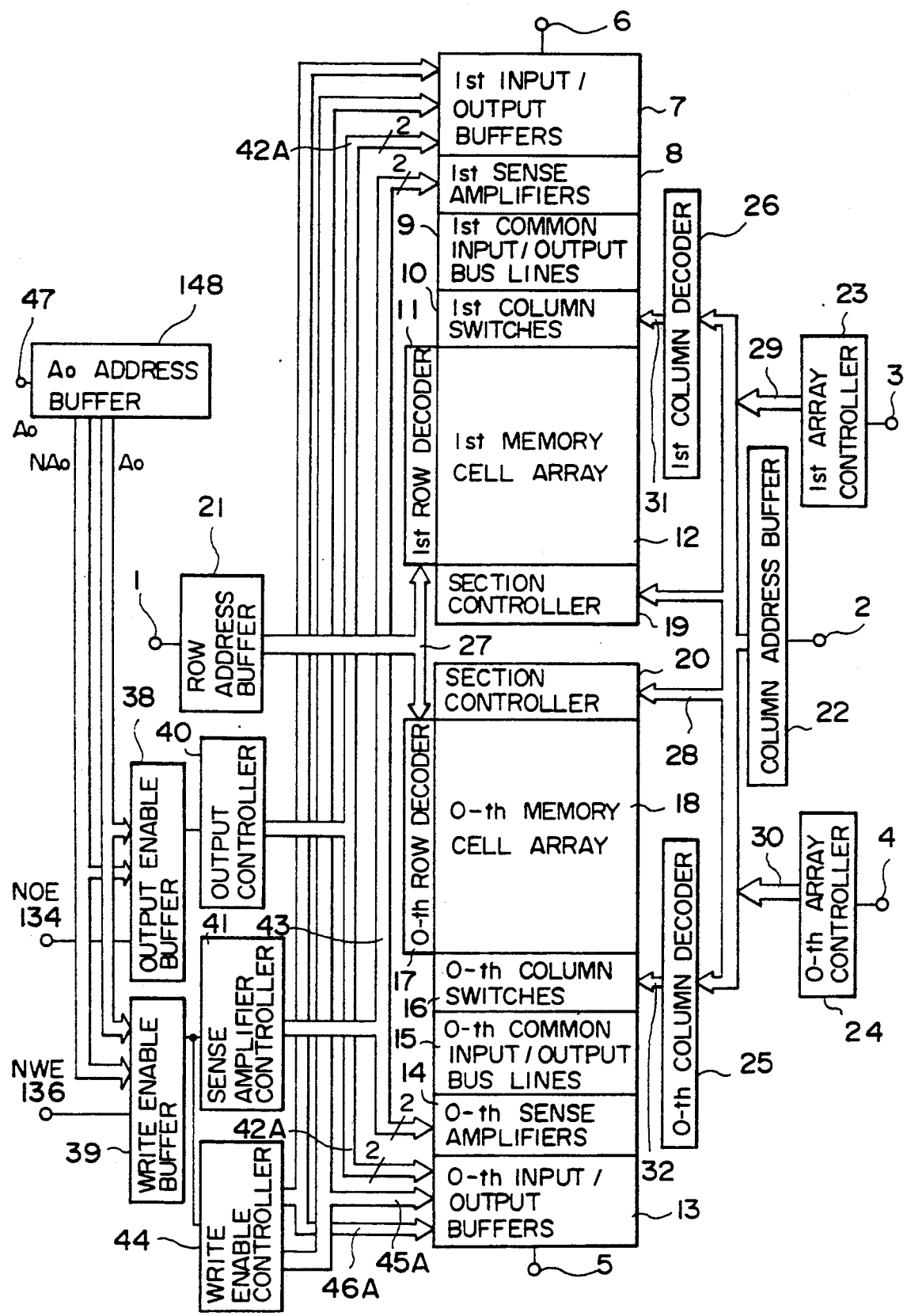
F I G. 3

MEMORY CELL ARRAY DIVIDED TYPE SEMICONDUCTOR MEMORY DEVICE

FIELD OF THE INVENTION

The present invention relates to a semiconductor memory device, and more particularly to a semiconductor memory device suitable for application to a memory cell array in which the array is divided into a plurality of blocks and memory cells in the respective blocks are accessed using the same address signal.

BACKGROUND OF THE INVENTION

A semiconductor memory device is known in which a memory cell array is divided into a plurality of blocks, sense amplifiers used for reading data are provided independently for each divided block of the memory cell array, and data can be written in memory cells of only all the divided blocks or of some of selected blocks. With such a semiconductor memory device, during a data write, sense amplifiers of the block not pertaining to the data write are made active, the same as during data read. Therefore, steady current will flow through sense amplifiers not pertaining to the essential operation.

As described above, with a conventional semiconductor memory device, during data write, sense amplifiers not pertaining to data write are made active, the same as during data read, allowing current to flow steadily. Power consumption will, therefore, increase. As the number of blocks increases, power consumption will increase correspondingly.

SUMMARY OF THE INVENTION

The present invention has been made in consideration of the above circumstances. It is therefore an object of the present invention to reduce current consumption during data write to memory cells in all or specific blocks, by making sense amplifiers of all blocks inactive.

During data write, a desired block is selected as an object data write block by block selecting means. Data is written by a write circuit to the memory cells of the selected block, or selected by a memory cell selector circuit. At this time, a sense amplifier control means supplies a signal to the sense amplifiers to make them inactive. In this manner, during data write, sense amplifiers of each block are made inactive during data write so that current will not be consumed.

As described above, according to the present invention, in a semiconductor memory device which reads/writes data in units of block, a control signal is supplied, at the time of data write, to sense amplifiers used for reading data. Therefore, wasteful steady current during data write can be suppressed, realizing a semiconductor memory device which reduces power consumption.

BRIEF DESCRIPTION OF THE DRAWINGS

FIG. 1 is a block diagram showing an embodiment of a semiconductor memory device according to the present invention.

FIG. 3 is a block diagram showing another embodiment of the present invention.

DESCRIPTION OF THE PREFERRED EMBODIMENTS

Figure 2:
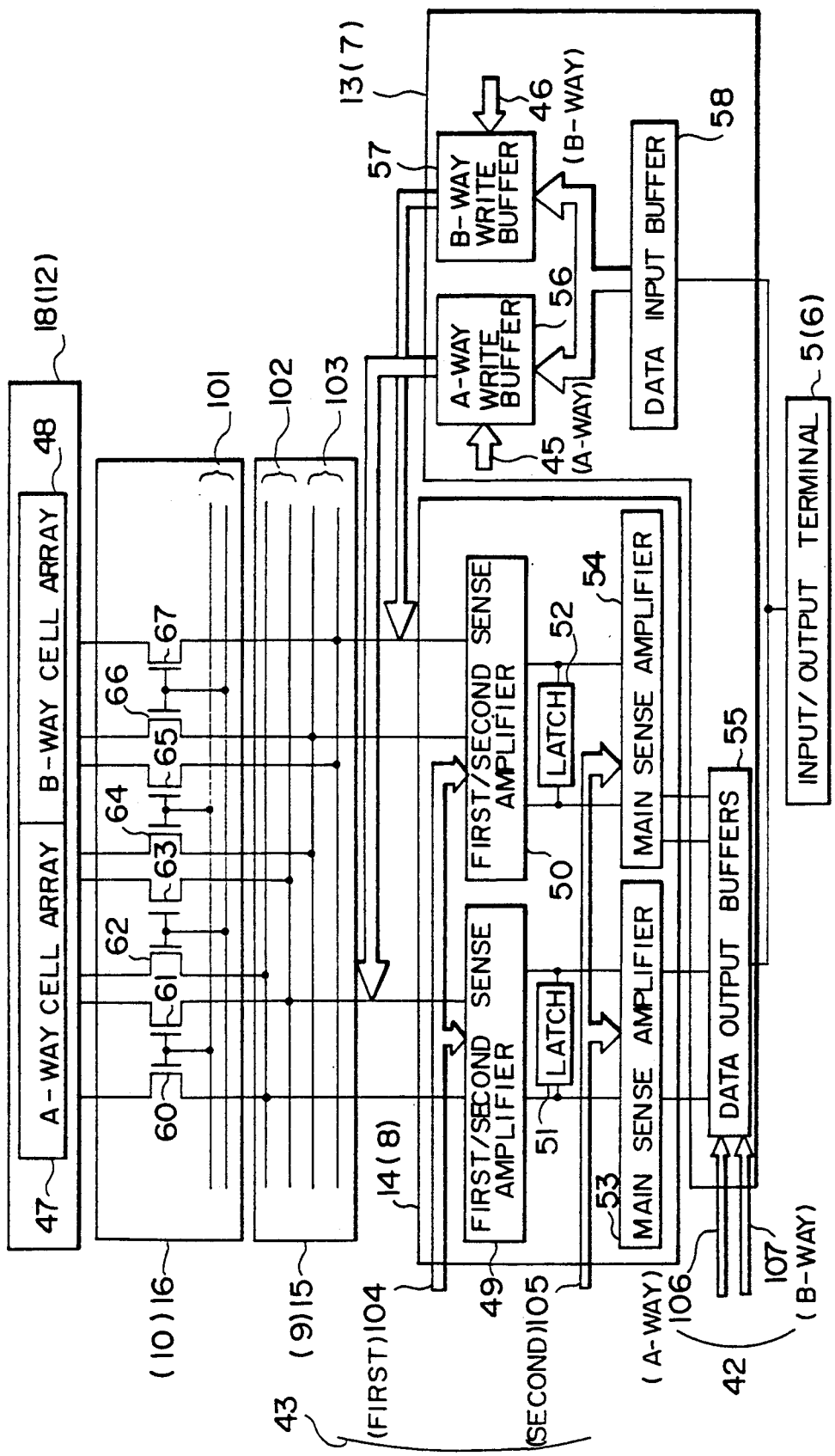
FIG. 2 is a block diagram showing the structure of a memory cell block of the type applied to the memory device shown in FIG. 1.

Preferred embodiments of the present invention will be described with reference to the accompanying drawings.

FIG. 1 is a block diagram showing a semiconductor memory device according to the present invention, particularly a semiconductor memory device of a two-way set associative type wherein a block of a main memory is allocated to two blocks of a cache memory. A cache memory is generally used by allocating a block of a main memory into one or more blocks of a cache memory. Allocating a block of a main memory to one block of a cache memory is called a direct mapping. Allocating a block of a main memory to N blocks of a cache memory is called an N-way set associative type. The present embodiments concern the latter type.

As shown in FIG. 1, a memory cell array can transfer data in units of a byte to and from a 16-bit CPU. The memory cell array is constructed of two memory cell array blocks including a 0-th memory cell array 18 and a first memory cell array 12. The arrays 18 and 12 are controlled by a 0-th array control signal 4 and a first array control signal 3, respectively. The arrays 18 and 12 can be accessed independently from each other or both at the same time. The 0-th array control signal 4 is inputted to a 0-th array controller 24 which, in turn, supplies a control signal to a column address bus 28 via a 0-th control bus 30. The first array control signal 3 is inputted to a first array controller 23 which, in turn, supplies a control signal to the column address bus 28 via a first control bus 29. A column address input signal 2 is supplied to the column address bus 28. On the side of the 0-th memory cell array 18, the column address bus 28 is connected to a 0-th section controller 20 and a 0-th column decoder 25. The 0-th column decoder 25 is connected to 0-th column switches 16 via a 0-th column control bus 32. On the side of the first memory cell array 12, the column address bus 28 is connected to a first section controller 19 and a first column decoder 26. The first column decoder 26 is connected to first column switches 10 via a first column control bus 31.

A row address input signal 1 is connected to a row address bus 27 via a row address buffer 21 which is connected to a 0-th row decoder 17 and a first row decoder 11.

The 0-th memory cell array 18 has the 0-th row decoder 17, 0-th section controller 20, 0-th column switches 16, 0-th common input/output bus lines 15, 0-th sense amplifiers 14, 0-th input/output buffers 13, and the like. the first memory cell array 12 has the first row decoder 11, first section controller 19, first column switches 10, first common input/output bus lines 9, first sense amplifiers 8, first input/output buffers 7, and the like. The 0-th input/output buffers 13 are connected to a 0-th external input/output terminal 5. The first input/output buffers 7 are connected to a first external input/output terminal 6.

External input signals 34 ($NOE_A$), 35 ($NOE_B$), 36 ($NWE_A$), and 37 ($NWE_B$) are control signals for the data read/write of the 0-th and first memory cell arrays 18 and 12. Signals $NOE_A$ and $NWE_A$ control A way (FIG. 2) in the 0-th and the first arrays 18 and 12. Signals $NOE_B$ and $NWE_B$ control B way (FIG. 2) in the 0-th and the first arrays 18 and 12. The external input signals 34 and 35 are supplied via output enable buffers 38 to an output controller 40 which supplies data output control signals 42 to the 0-th and first input/output buffers 13 and 7. As a result, data read from the buffers 13 and 7 can be controlled. The external input signals 36 and 37 are supplied via write enable buffers 39 to a write enable controller 44 which supplies write control signals 45 and 46 to the 0-th and first input/output buffers 13 and 17. As a result data write to the 0-th and first memory cell arrays 18 and 12 can be controlled. Outputs from the write enable buffers 39 are also supplied to a sense amplifier controller 41 which supplies sense amplifier control signals 43 to the 0-th and first sense amplifiers 14 and 8 for controlling them. As a result, data write to the 0-th and first sense amplifiers 14 and 8 can be controlled.

FIG. 2 shows the structure of the 0-th and first memory cell arrays 18 and 12 shown in FIG. 1. As shown in FIG. 2, the memory cell array is divided into two blocks each including an A-way cell array 47 and a B-way cell array 48. Signals on column select lines 101 turn on and off column transfer gates 60 to 67 to select one column of each block. Each column transfer gate 60 through 67 is connected via A- and B-way common input/output bus lines 102 and 103 to first/second sense amplifiers 49 and 50. Outputs from the first/second sense amplifiers 49 and 50 are transferred via main sense amplifiers 53 and 54 to data output buffers 55. Two first/second sense amplifiers 49 and 50 are controlled by a first sense amplifier control signal 104. Latches 51 and 52 are provided on the output side of the two first-/second sense amplifiers 49 and 50. Main sense amplifiers 53 and 54 are controlled by a second sense amplifier control signal 105. Data output from the data output buffers 55 is controlled by A- and B-way output control signals 106 and 107. Data is outputted from the data output buffer 55 to an input/output terminal 5 (or 6). Data is inputted via the data input/output terminal 5 (or 6) to a data input buffer 58, and then to A- and B-way write buffers 56 and 57. The A-way write buffer 56 is controlled by an A-way write control signal 45, and the B-way write buffer 57 is controlled by a B-way write control signal 46. Data outputted from the A-way write buffer 56 is supplied to A-way common input/output bus lines 102 and written in the A-way cell array 47. Data outputted from the B-way write buffer 57 is supplied to B-way common input/output bus lines 103 and written in the B-way cell array 48.

The first/second sense amplifier 49 and main sense amplifier for reading data from the A-way cell array 47 and the A-way write buffer 56 for writing data, are provided for use only by the A-way cell array 47. The first/second sense amplifier 50 and main sense amplifier 54 for reading data from the B-way cell array 48 and the B-way write buffer for writing data, are provided for use only by the B-way cell array 48. The system including the A- and B-way cell arrays 47 and 48 are contained in each of the 0-th and first memory cell arrays 18 and 12 shown in FIG. 1.

With the semiconductor memory device constructed as above, as the data read paths, an A-way cell array 47 series path and a B-way cell array 48 series path are provided for each block. Similarly, as the data write paths, an A-way write buffer 56 series path and a B-way write buffer 57 series path are provided for each block. These two write paths are controlled by two different signals, A-way write control signal 45 and B-way write control signal 46. Therefore, in writing the same data, different types of accesses can be made to the two blocks, A-way cell array 47 and B-way cell array 48. Namely, the same data is written to both the two blocks, or to one of the two blocks. On the other hand, in the case of reading data, both the output data from the A-way cell array 47 and B-cell array 48 are transferred to the first/second sense amplifiers 49 and 50 and main sense amplifiers 53 and 54. As a result, the data to be outputted is determined finally by the A- and B-way output control signals 106 and 107 at the last stage data output buffers 55.

The cache memory of the present embodiment has two array blocks, 0-th and first memory cell arrays 18 and 12, in order to allow byte unit access, as seen from FIG. 1. It is therefore possible to write data in four memory cells at the maximum at one time, i.e., in the four memory cells of the A- and B-way cell arrays 47 and 48 of the 0-th memory cell array 18 and the A- and B-way cell arrays 47 and 48 of the first memory cell array 12. This cache memory is of a two-way set associative type for a 16-bit CPU. As the numbers of bits and ways increase, the number of memory cells accessible at a time increases. The number of memory cells in which data can be written at a time is represented by N bytes×M ways.

As described so far, data can be written in a predetermined number of memory cells at a time during one cycle. Therefore, data write time can be shortened as compared to the case where data is written in one memory cell during one cycle. It is very efficient to write the same data in a number of memory cells. For example, data write time for writing the same data in all memory cells using the circuit structure shown in FIGS. 1 and 2 can be shortened to one fourth of an ordinary case. It is advantageous that the time required for a memory test such as reading/writing the same data can be shortened.

As described previously, the A-way cell array 47 series, and B-way cell array 48 series shown in FIG. 2, are independent of each other, so that data can be written independently. The first and second sense amplifier control signals 104 and 105 for making the first/second sense amplifiers 49 and 50 and main sense amplifiers 53 and 54 are provided in common to each block. Consider the case if these control signals 3 are used separately between the A-way side and B-way side, and data is written to one of the A- and B-ways. In such a case, of the first/second sense amplifiers 49 and 50 and main sense amplifiers 53 and 54, those sense amplifiers on the data write side way are controlled to be inactive, whereas those sense amplifiers on the other side way are made active state corresponding to data read. Therefore, steady current flows through the sense amplifiers on the other way side, increasing power consumption in spite of data write state. In contrast, according to this embodiment, the first sense amplifier control signal 104 for the first/second sense amplifiers 49 and 50 is common to both the A- and B-ways, and the second sense amplifier control signal 105 for the main sense amplifiers 53 and 54 is common to both the A- and B-ways. As a result, in the case of data write state of one of the ways, the first/second sense amplifiers 49 and 50 and main sense amplifiers 53 and 54 are all made inactive. Therefore, steady current will not flow through sense amplifiers not pertaining to data write, reducing power consumption.

In this above embodiment, a cache memory of a two-way set associative type has been described by way of example. The present invention is applicable not only to block units as ways, but also to other circuits such as an ordinary semiconductor memory device which is divisionally selected using addresses $NA_O$, $A_O$, and the like.

Figure 4:
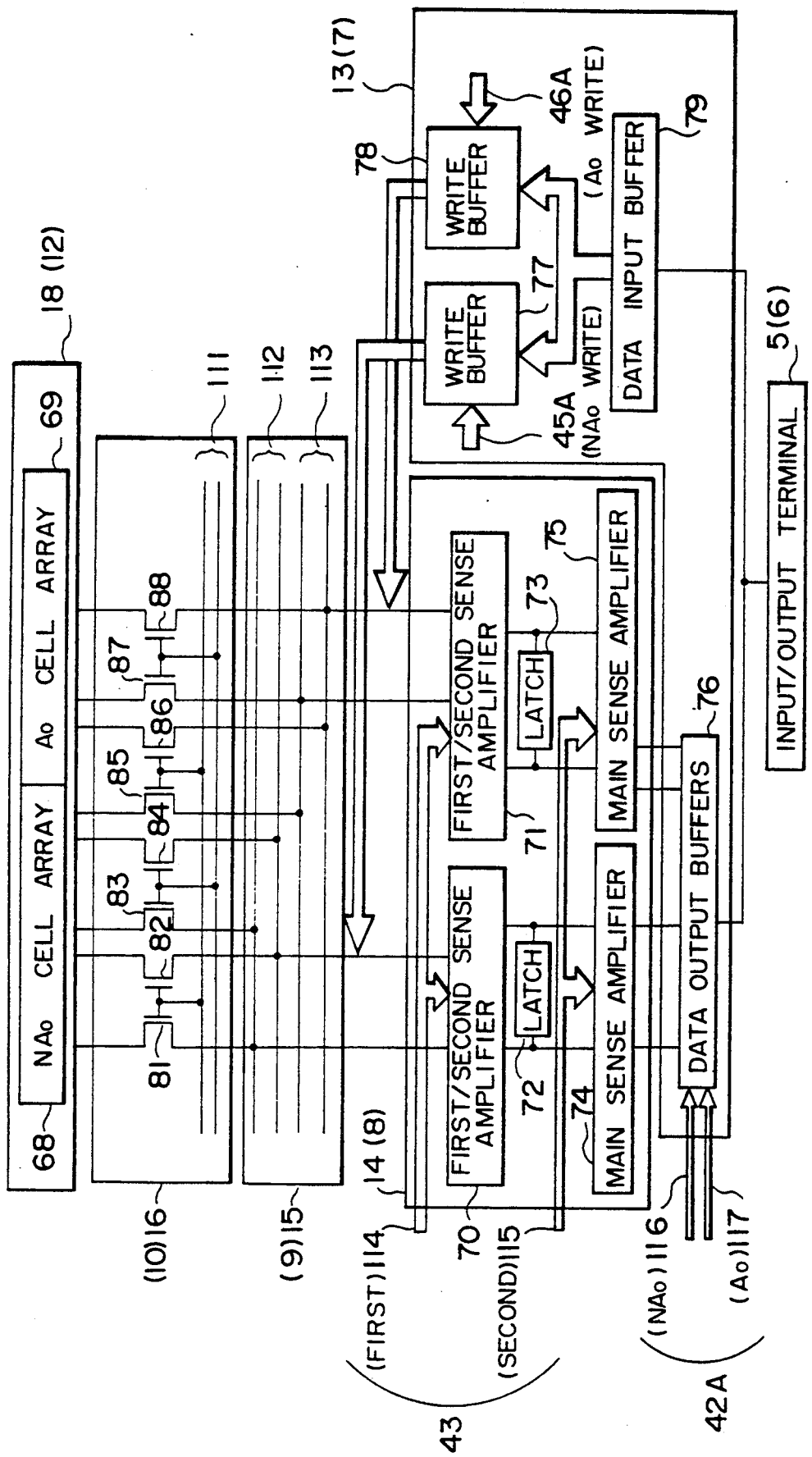
FIG. 4 is a block diagram showing the structure of a memory cell block, applied to the memory device shown in FIG. 3.

FIG. 3 shows one such example. An address external input signal 47 ($A_O$) is applied to $A_O$ address buffer 148. The buffer 148 outputs address signals $A_O$ and $NA_O$ to apply output enable buffers 38 and 39. These signals $NA_O$, $A_O$ select $NA_O$ or $A_O$ cell arrays 68 or 69 (FIG. 4). These buffers 38 and 39 receive output enable external input signal 134 (NOE) and write enable external input signal 136 (NWE).

FIG. 4 is a block diagram showing part of a semiconductor memory device illustrated in FIG. 3. As shown in FIG. 4, a memory cell array is divided into two blocks including an $NA_O$ cell array 68 and an $A_O$ cell array 69. A signal on column select lines 111 turns on and off column transfer gates 81 to 88 to select one column of each block. Each column transfer gate 81 through 88 is connected to first/second sense amplifiers 70 and 71 via $NA_O$ common input/output bus lines 112 and $A_O$ common input/output bus lines 113. Outputs from the first/second sense amplifiers 70 and 71 are transferred via main sense amplifiers 74 and 75 to data output buffers 76. The first/second sense amplifiers 70 and 71 are controlled by first sense amplifier control signal 114. Latches 72 and 73 are provided of the output side of first/second sense amplifiers 70 and 71. The main sense amplifiers 74 and 75 are controlled by a second sense amplifier control signal 115. Data output from the data output buffers 76 is controlled by $NA_O$ and $A_O$ output control signals 116 and 117. Data is outputted from the data output buffer 76 to an input/output terminal 5 (or 6). Data is inputted via the data input/output terminal 5 (or 6) to a data input buffer 79, and then to write buffers 77 and 78. The write buffer 77 is controlled by an $NA_O$ write control signal 45A, and the write buffer 78 is controlled by an $A_O$ write control signal 46A. Data outputted from the write buffer 77 is supplied to $NA_O$ common input/output bus lines 112 and written in the $A_O$ cell array 68. Data outputted from the write buffer 78 is supplied to $A_O$ common input/output bus lines 113 and written in the $A_O$ cell array 69.

The structure and operation of the device shown in FIG. 4 is similar to those of the device shown in FIG. 2. During data write, the first sense amplifier control signal 114 makes the first/second sense amplifiers 70 and 71 inactive, and the second sense amplifier control signal 115 makes the main sense amplifiers 74 and 75 inactive. Therefore, steady current can be suppressed to realized low power consumption.

What is claimed is:

1. A memory device having any given number of memory blocks, each of the memory blocks, comprising:

a plurality of way cell arrays to and from each of which data can be written and read independently from said other way cell arrays;

memory cell selecting means for selecting a memory cell of each of said way cell arrays on the basis of an external address signal, respectively, the selected memory cells having the same common address mutually in said way cell arrays;

a plurality of sense amplifying means provided for each of said way cell arrays, for sensing and amplifying data read out of the memory cells, said sense amplifying means being allowed to be operative or inoperative in response to a sense control signal in data read/write operations;

data output buffer means for outputting outputs of said sense amplifying means to the outside; and a plurality of way write buffer means provided for each of said wall cell arrays, are allowed to be any given number of said way write buffers being selectively operative on the basis of write way control signals, to write data in the selected memory cells of said way cell arrays corresponding thereto.

2. The memory device of claim 1, wherein said memory cell selecting means comprises a row decoder and a column decoder, the external address being applied to said row and column decoders to select the memory cells of the same common address simultaneously in said respective way cell arrays.

3. The memory device of claim 1, which further comprises sense amplifier control means for forming the sense amplifier control signal on the basis of the write way control signals.

4. The memory device of claim 2, which further comprises sense amplifier control means for forming the sense amplifier control signal on the basis of the write way control signals.

5. The memory device of claim 3, which further comprises output control means for applying an output control signal to said data output buffer means, to selectively output data from one of said sense amplifier means in the data read operation.

6. The memory device of claim 4, which further comprises output control means for applying an output control signal to said data output buffer means, to selectively output data from one of said sense amplifier means in the data read operation.

7. The memory device of claim 5, which further comprises data input buffer means connected to said way write buffer means connected in parallel to each other, for transmitting write data.

8. The memory device of claim 6, which further comprises data input buffer means connected to said way write buffer means connected in parallel to each other, for transmitting write data.

9. The memory device of claim 7, wherein each of said sense amplifier means is composed of series-connected multi-state sense amplifiers.

10. The memory device of claim 8, wherein each of said sense amplifier means is composed of series-connected multi-stage sense amplifiers.

11. The memory device of claim 9, further comprising latch means connected between two of the multi-stage sense amplifiers constituting said sense amplifier means, for latching an output of the front-stage sense amplifier and transmitting the latched output to the succeeding-stage sense amplifier, respectively.

12. The memory device of claim 10, which further comprises latch means connected between two of the multi-stage sense amplifiers constituting said sense amplifier means, for latching an output of the front-stage sense amplifier and transmitting the latched output to the succeeding-stage sense amplifier, respectively.

13. The memory device of claim 11, wherein an input/output terminal is connected in common to said data output buffer means and said data input buffer means, to receive read data from said data output buffer means and transmit write data to said data input buffer means, respectively.

14. The memory device of claim 12, wherein an input/output terminal is connected in common to said data output buffer means and said data input buffer means, to receive read data from said data output buffer means and transmit write data to said data input buffer means, respectively.

15. The memory device of claim 13, wherein the given number of the memory blocks are more than one.

16. The memory device of claim 14, wherein any given number of the memory blocks are more than one.

* * * * *